United States Patent [19]
Mattos et al.

[11] Patent Number: 6,018,274
[45] Date of Patent: Jan. 25, 2000

[54] RADIO RECEIVER AND FREQUENCY GENERATOR FOR USE WITH DIGITAL SIGNAL PROCESSING CIRCUITRY

[75] Inventors: Philip G. Mattos, Ruardean Woodside; Mark A. Beach, Langford, both of United Kingdom

[73] Assignees: STMicroelectronics Limited; University of Bristol, both of Bristol, United Kingdom

[21] Appl. No.: 08/669,007

[22] Filed: Jun. 21, 1996

[30] Foreign Application Priority Data

Jun. 22, 1995 [GB] United Kingdom .................... 9512732

[51] Int. Cl.[7] ............................... H03B 5/12; H03B 5/18; H03B 5/36
[52] U.S. Cl. ................................. 331/60; 331/77; 331/96; 331/116 R; 331/158; 455/255; 455/334
[58] Field of Search .................................. 331/60, 77, 96, 331/105, 116 K, 116 FE, 117 R, 117 FE, 117 D, 107 DP, 107 SL, 158, 37, 42, 43; 455/255, 314, 130, 313, 334

[56] References Cited

U.S. PATENT DOCUMENTS

| | | | |
|---|---|---|---|
| 2,817,761 | 12/1957 | Hollmann | 331/117 D |
| 3,315,180 | 4/1967 | Racy | 331/117 D |
| 4,859,969 | 8/1989 | Malinowski | 331/43 |
| 5,263,197 | 11/1993 | Manjo et al. | 455/324 |

FOREIGN PATENT DOCUMENTS 2 587 153  3/1987  France .

WO-A-94 05087  3/1994  WIPO .

*Primary Examiner*—David Mis
*Attorney, Agent, or Firm*—Theodore E. Galanthay; David V. Carlson; Seed and Berry LLP

[57] ABSTRACT

The present invention relates to a radio receiver, particularly to a receiver for use in single-frequency applications, such as GPS, and to a frequency generator, which may be used in such a radio receiver, or elsewhere. The frequency generator comprises a tuned circuit connected between the emitter of the transistor and ground, such that a voltage signal at the basic frequency appears on the emitter terminal of the transistor. This arrangement has the advantage that the two frequencies appear on separate ports, and provides a radio receiver including radio receiver circuitry for connection to digital signal processing circuitry, reducing the complexity of the overall circuit. Additionally, there is a radio receiver wherein separate first and second local oscillator signals are generated from the terminal of s single transistor, avoiding the need for cascade multiplication stages, again reducing the size and complexity of the overall circuit. Further, circuitry is included generating an oscillator signal whereby the signal processing means tolerates the resulting frequency errors, and a single frequency direct downconversion receiver, comprising means for sub-sampling and one-bit coding the demodulated signal, and a transistor capable of decoding a microwave local oscillator signal and a digital signal processor with a clock signal for tolerating frequency errors.

13 Claims, 3 Drawing Sheets

RADIO RECEIVER AND FREQUENCY GENERATOR FOR USE WITH DIGITAL SIGNAL PROCESSING CIRCUITRY

CROSS-REFERENCE TO RELATED APPLICATION

This application claims priority from British application 9512732.0, filed Jun. 22 1995, which is hereby incorporated by reference.

BACKGROUND AND SUMMARY OF THE INVENTION

The present invention relates to a radio receiver, particularly to a receiver for use in fixed-frequency applications such as GPS, and to a frequency generator, which may be used in such a radio receiver, or elsewhere.

GPS receivers have until now conventionally used expensive temperature controlled crystal oscillators, in order to achieve the required accuracy in frequency generation. The present invention seeks to provide a system which permits a less expensive method of frequency generation, and also to provide a particularly economic method of frequency generation, without using a temperature controlled crystal oscillator, voltage controlled oscillator, phase-locked oscillator or synthesizer. This approach results in greatly enhanced phase noise performance.

According to a first aspect of the present invention, there is provided a frequency generator, comprising: a single transistor oscillator arranged such that a signal of a basic frequency appears at a first output terminal of the transistor; and at least one reactive circuit element, having an impedance which increases with increasing frequency throughout a frequency range of interest, the reactive circuit element being connected to the same transistor such that a signal of a second frequency appears at a second output terminal of the same transistor, the second frequency being within the said frequency range, and being a multiple of the basic frequency.

Advantageously, the basic and second frequencies may be widely spaced, for example by a factor of about 20, such that the second frequency may be in the microwave range, while the basic frequency may be useable, directly or after division, as a system reference frequency.

Preferably, the frequency generator comprises a tuned circuit between the emitter of the transistor and ground, such that a voltage signal at the basic frequency appears on the emitter terminal of the transistor. Preferably the reactive element is connected between the collector terminal of the transistor and a power supply rail. Preferably the reactive element is chosen such that the signal appearing on the collector terminal of the transistor include higher order multiples of the basic frequency, for example twenty times the basic frequency.

Preferably the reactive element is chosen such that it has a high impedance in the region of the second frequency.

This arrangement has the advantage that the two frequencies appear on separate ports. The basic frequency needs no further filtering, while the harmonic frequency appearing on the collector terminal includes only very small components of the basic frequency. Further filtering is then needed only to remove adjacent harmonics which will also appear.

According to a second aspect of the present invention, there is provided a radio receiver including radio receiver circuitry for connection to digital signal processing circuitry, and comprising a single transistor oscillator arranged such that a signal of a basic frequency appears at a first output terminal of the transistor; and at least one reactive circuit element, having an impedance which increases with increasing frequency throughout a frequency range of interest, the reactive circuit element being connected to the same transistor such that a signal of a second frequency appears at a second output terminal of the same transistor, the second frequency being within the said frequency range, and being a multiple of the basic frequency, wherein the second frequency is used as a local oscillator frequency for the radio receiver circuitry and the basic frequency signal is used as a clock frequency for the signal processor.

Clearly, this has the advantage that it reduces the complexity of the overall circuit.

According to a third aspect of the present invention, there is provided a radio receiver, comprising a single transistor oscillator arranged such that a signal of a basic frequency appears at a first output terminal of the transistor; and at least one reactive circuit element, having an impedance which increases with increasing frequency throughout a frequency range of interest, the reactive circuit element being connected to the same transistor such that a signal of a second frequency appears at a second output terminal of the same transistor, the second frequency being within the said frequency range, and being a multiple of the basic frequency, wherein the second frequency signal is used as a first local oscillator signal and the basic frequency signal is used as a second local oscillator signal.

According to a fourth aspect of the present invention, there is provided a radio receiver, including radio receiver circuitry having means for generating an oscillator signal, and signal processing means, characterized by the use of an uncompensated oscillator for generating the oscillator signal, whereby the signal processing means tolerates the resulting frequency errors.

By the term "uncompensated" is meant that the circuit is not compensated against variations due to temperature, tolerances, or ageing. Thus, there is no temperature sensing, or means of applying an active control to the tuned circuits.

Preferably, the final mixer in the receiver circuitry is either software controlled hardware or implemented wholly in software to remove any residual offset.

Thus, frequency errors in the oscillator signal may be of the order of tens of parts per million, rather than a few parts per million, without any deterioration in the final output.

According to a fifth aspect of the present invention, there is provided a fixed frequency dual downconversion receiver, comprising: an analogue first downconversion and IF filter stage; means for one-bit coding of the downconverted signal; and means for second downconversion by digital subsampling.

According to a sixth aspect of the present invention, there is provided a fixed frequency dual downconversion radio receiver, having: an analog first downconversion and IF filter stage; means for one-bit coding of the downconverted signal; means for second downconversion by digital subsampling; means for generating a microwave local oscillator signal comprising an uncompensated crystal and a single transistor, the microwave local oscillator signal appearing on one terminal of the transistor, and a reference frequency appearing on another terminal of the transistors; and a digital signal processor, having a reference frequency (derived directly or by division from the basic frequency) as its clock signal, and comprising means for tolerating frequency errors arising from the use of the uncompensated crystal in the frequency generator.

According to a seventh aspect of the present invention, there is provided a method of processing a received radio signal in a receiver, the method comprising: downconverting the signal to an IF; filtering the downconverted signal; one-bit coding the filtered downconverted signal; and digitally subsampling the coded signal.

BRIEF DESCRIPTION OF THE DRAWING

The disclosed inventions will be descried with reference to the accompanying drawings, which show important sample embodiments of the invention and which are incorporated in the specification hereof by reference, wherein.

For a better understanding of the present invention, and to show how it may be brought into effect, reference will now be made, by way of example, to the accompanying drawings, in which.

DETAILED DESCRIPTION OF THE PREFERRED EMBODIMENTS

Figure 1:
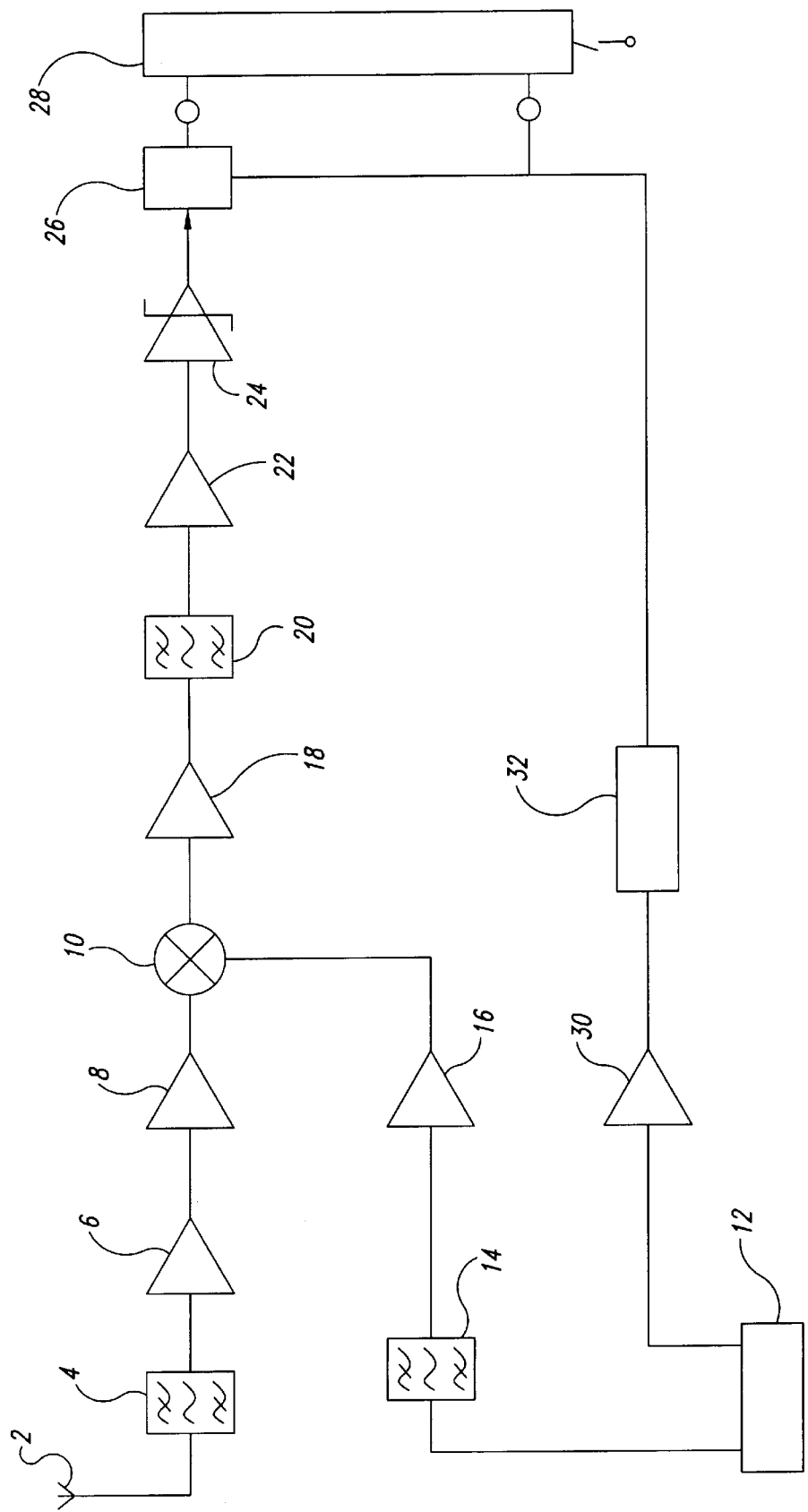
FIG. 1 is a block circuit diagram of a radio receiver in accordance with the invention.

The numerous innovative teachings of the present application will be described with particular reference to the presently preferred embodiment (by way of example, and not of limitation), in which:

FIG. 1 shows the general form of a radio receiver in accordance with the invention. The receiver includes an antenna 2, RF filter 4 and first-stage amplifier 6. The resulting filtered signal is supplied to an amplifier 8 and mixer 10. An oscillator circuit 12 supplies a local oscillator signal through a filter 14 and an amplifier 16 to the mixer 10. The resulting downconverted signal is supplied through an amplifier 18, filter 20, and further amplifier 22 to an A/D converter 24, such as a comparator in single-bit coded systems. The data output from the converter 24 are supplied to an edge-triggered flip-flop 26 clocked at a suitable frequency to alias the IF frequency to the required frequency for the transfer to the processor 28.

This structure minimizes the number of mixer stages and reduces the need for expensive filters.

Connected to the processor 28 are the various memories, input/output devices, etc, (not shown), necessary for carrying out the required data processing functions. For example, in the case of a GPS system, the processor 28 may be a GPS-specific processor for carrying out the required signal detection, data and timing extraction.

The clock signals for the latching device 26 and the CPU 28 are also provided from the same frequency generator 12 which provides the local oscillator signal to the mixer 10. A second output from the frequency generator 12 is supplied through an amplifier 30, and a frequency division stage 32, for supply to the latching device 26 and CPU 28.

This arrangement has the advantage that only a single frequency generator circuit needs to be provided. Moreover, the frequency generator is such that it avoids the need for cascading frequency multipliers, and supplies the different required frequencies on different output pins. The frequency generator 12 is shown in more detail in FIG. 2.

The frequency generator is based around a crystal 42, which is connected between the base of a transistor 44 and a ground rail 46. Particularly advantageously, the crystal can be a simple, uncompensated device, although the addition of a compensated oscillator, such as a "TCXO" or temperature-controlled crystal oscillator, or an "OCXO" or oven-controlled crystal oscillator, will be advantageous in circumstances in which frequency errors cannot be tolerated; however, this will incur additional cost and phase noise penalties. A tuned circuit comprising an inductor L1 and a capacitor C1 in parallel is connected between the emitter of the transistor 44 and the ground rail 46. This tuned circuit has the effect of selecting one of the modes from the crystal 42, such that the signal on the first output 48 is largely composed of this frequency (for example the fifth overtone of the crystal 42), which is a basic frequency $f_B$ for the oscillator circuit 12, and which needs no further filtering.

A resistor R1 is connected between the collector of the transistor 44 and a power supply rail 50, and a resistor R2 is connected between the base of the transistor 44 and the resistor R1. Capacitors C3, C4 are connected between the resistor R1 and ground.

So far, the circuit as described is conventional. However, the invention involves including between the collector of the transistor 44 and the resistor R1 a reactive element, for example an inductor L2.

Figure 3A:
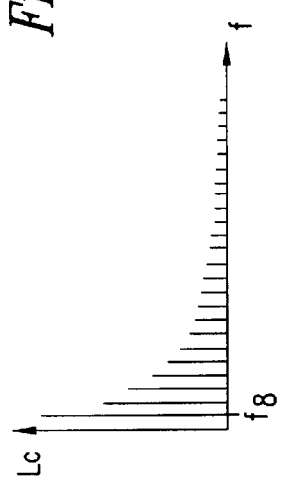
FIGS. 3a–3c illustrate the operation of the circuit of FIG. 2.
Figure 3B:
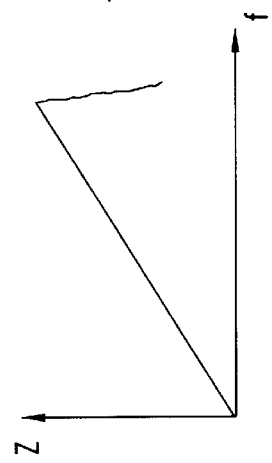

The current $i_c$ at the collector of the transistor is at the basic frequency $f_B$, and its harmonics, as shown in FIG. 3a. However, at low frequencies such as the basic frequency $f_B$, the impedance of the inductor L2 is very low, and so the collector of the transistor 44 is effectively grounded through the capacitors C3, C4. As a result, there is only a minimal voltage signal at the collector. At higher frequencies, the impedance of the inductor L2 increases. In theory, this impedance should carry on increasing, proportionately with the increasing frequency. However, at the high frequencies used here, the performance of real inductances varies very considerably from their nominal performance due to a form of self-resonance, as illustrated schematically in FIG. 3b, which shows the impedance Z of the inductance L2 plotted against frequency f. The value of the inductor is made as large as possible consistent with practical realizability at the frequency. For example, the nominal value of the inductance L2 may be in the range of 10 nH or a few tens of nH.

Figure 3C:
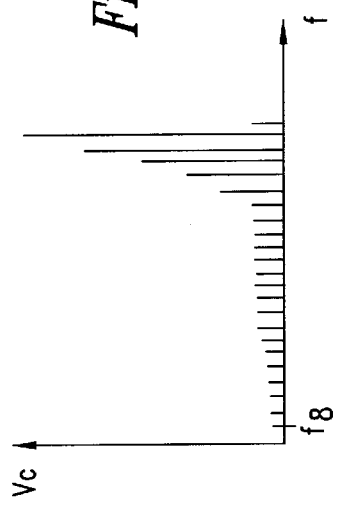

The result of this is that the voltage $V_c$ which appears at the fcollector of the transistor 44 is, as shown in FIG. 3c, largely composed of the higher order harmonics of the basic frequency $f_B$, but that the inductance L2 must be chosen such that the desired second frequency output signal is within the linear region of the characteristic of the inductor. For example, to obtain a second output frequency at 19 times the basic frequency $f_B$ the inductance L2 must be chosen such that this frequency is within the linear region of the characteristic, i.e. such that the signal at the collector 44 of the transistor is strongest at a frequency higher than 19 times the basic frequency. For economic and practical reasons, it will probably be advantageous for this frequency to be higher than the second frequency by a small margin dependent on component tolerances.

Thus, the signal which appears on line 52 has only minimal corruption by the basic frequency. This output of the frequency generator can be connected to a filter to remove this corruption, and the adjacent harmonics, to give a reference signal which is, for example, 19 or 20 times the basic frequency $f_B$.

For example, the basic frequency fB, may be approx 82 MHz, and the second frequency may be around 1555 MHz.

It may be possible to achieve higher frequencies, and higher multiplication factors, by using printed components, rather than discrete components.

Therefore, the two required reference frequencies, one being a multiple of the other, are provided by means of a simple circuit arrangement, without requiring cascade multiplication.

In the receiver shown in FIG. 1, the use of an uncompensated oscillator 42 has the advantage that significant cost savings can be made, compared with the use of, for example, a TCXO. However, the resulting frequency errors may be in the region of 50 ppm, as opposed to 3 ppm if a TCXO is used. In accordance with aspects of the present invention, these frequency errors are tolerated by the signal processing device. In effect, a digital mixer, under control of software in the digital signal processor which forms part of the CPU 28, is software controlled. The digitally generated local oscillator signal supplied to that final mixer is continually controlled to the required frequency, to remove remaining residual frequency offsets.

Figure 2:
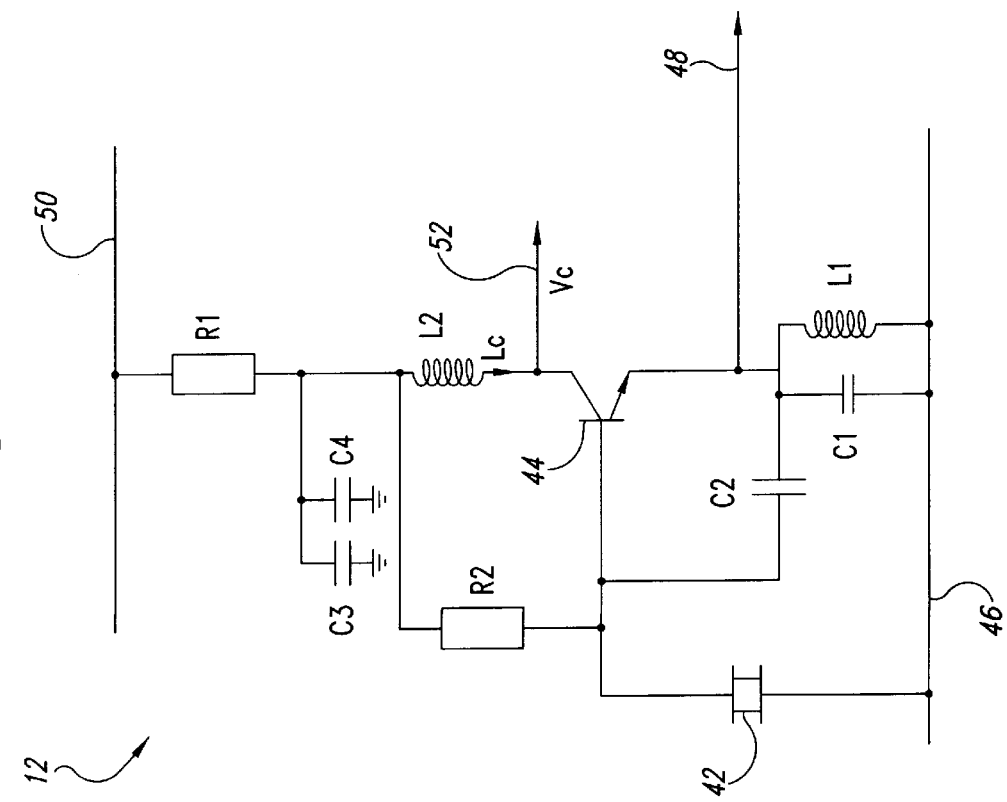
FIG. 2 is a circuit diagram of the frequency generator in accordance with the invention.

There are therefore provided arrangements which are particularly advantageous in GPS system design, although it will be noted that they are of use in any fixed frequency radio receiver context. In particular, these arrangements enable the manufacture of small, economic GPS systems, which may for example be incorporated into mobile telephones. Then, the GPS system within a telephone can inform a base station of a location of the mobile unit on call initiation, allowing appropriate base station selection. In addition, the frequency generator arrangement, as shown in FIG. 2, may be used in any context. Where a receiver requires additional downconversion stages, the frequency generator 12 may also be used to provide a second LO signal. In that case, the frequency divider stage 32 may be split into two sections, with the second LO signal being taken off after a first frequency division stage, and further frequency division being applied to generate the required clocking signals.

Sample specific component values, in the circuit of FIG. 2, include the following:
R1—470 Ω
R2—10 k Ω
C1—47 pF/220 pF
C2—33 pF
C3—10 pF
C4—1000 pF
L1—150 nH
L2—18 nH.
Transistor 44, in the presently preferred embodiment, is an NE885.
Crystal 42, in the presently preferred embodiment, is a UM1, operating at its 5th overtone, 81.84 MHz.
Filter 14, in the presently preferred embodiment, is a Murata DFC21B57P002.
All inductors are Coilcraft 1206 series, and all capacitors are Murata 1206 series.

Figure 4:
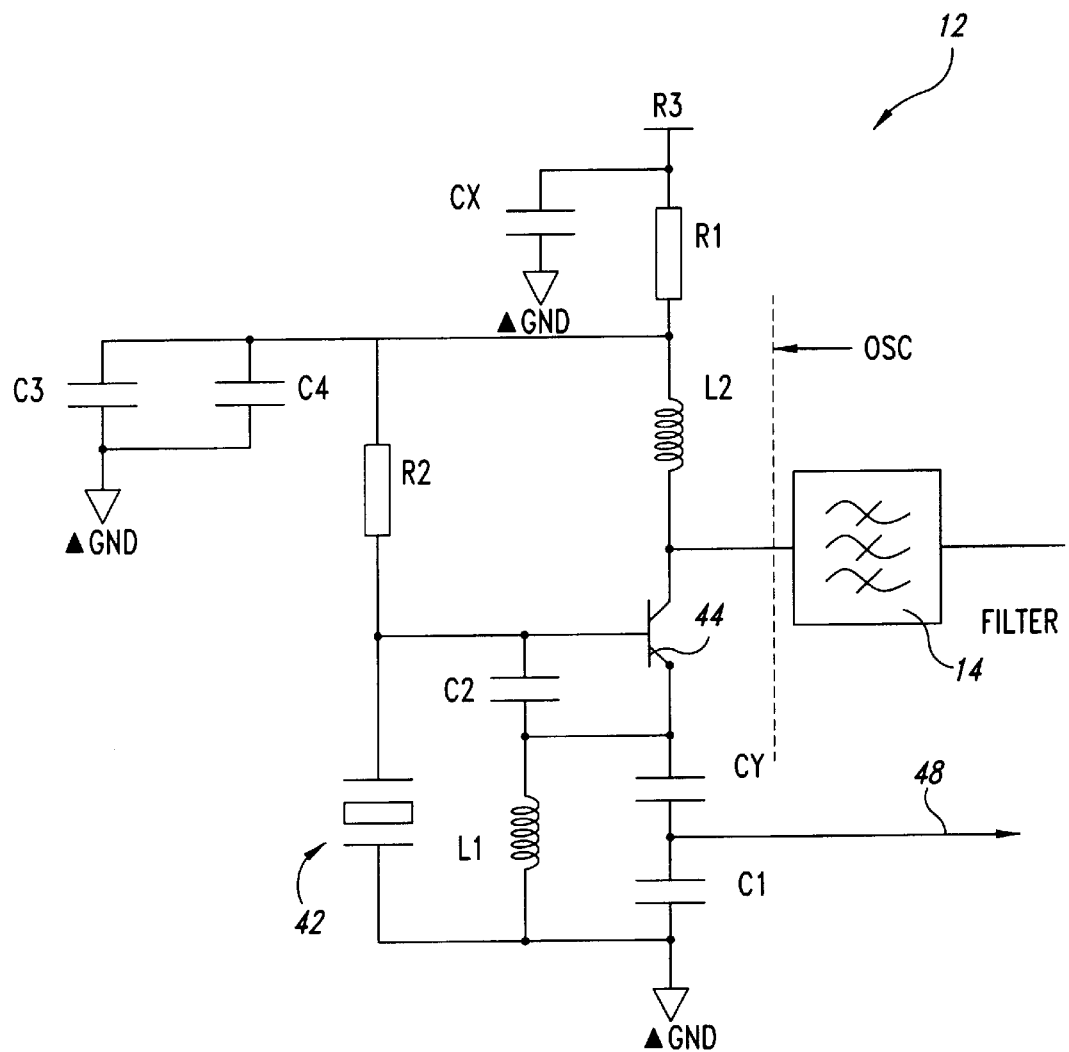
FIG. 4 shows even more details of the implementation of the oscillator and filter stage used in FIG. 2.

FIG. 4 shows a slightly different implementation of the oscillator and filter stage of FIG. 2. CX is a 1 nF capacitor, connected between the positive supply rail (3.3 V) and ground. Also the split of C1 is explicitly shown: capacitor C1', in this embodiment, is 47 pF, and additional capacitor CY (between the emitter of transistor 44 and output 48) is 220 pF.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

For example, a wide variety of additional filtering stages can be used in combination with the circuitry of FIGS. 1 and 2. See generally MICROWAVE FILTERS, IMPEDANCE MATCHING NATWORKS, AND COUPLING STRUCTURES (ed. Matthaei), which is hereby incorporated by reference.

Of course the specific component values and topologies shown do not by any means delimit the invention, but are merely illustrative.

What is claimed is:

1. A frequency generator, comprising:
   a single transistor oscillator arranged such that a signal of a basic frequency appears at a first output terminal of the transistor; and
   at least one reactive circuit element, having an impedance which increases with increasing frequency throughout a frequency range of interest, the reactive circuit element being connected to a second output terminal of the same transistor and being connected to AC ground such that a signal of a second frequency appears at the second output terminal of the same transistor, the second frequency being within the said frequency range, and being a multiple of the basic frequency.

2. A frequency generator as claimed in claim 1, wherein the basic and second frequencies are widely spaced, such that the second frequency may be in the microwave range, while the basic frequency may be useable as a system reference frequency.

3. A frequency generator as claimed in claim 2, wherein the second frequency is about twenty times the basic frequency.

4. A frequency generator is claimed in claim 1, wherein the frequency generator comprises a tuned circuit connected between the emitter of the transistor and ground, such that a voltage signal at the basic frequency appears on the emitter terminal of the transistor.

5. A frequency generator as claimed in claim 1, wherein the reactive element is connected between the collector terminal of the transistor and a power supply rail.

6. A frequency generator as claimed in claim 1, wherein the reactive element is chosen such that the signal appearing on the collector terminal of the transistor includes higher order multiples of the basic frequency, for example twenty times the basic frequency.

7. A frequency generator is claimed in claim 1, wherein the reactive element is chosen such that it has a maximum impedance in the region of the second frequency.

8. A frequency generator as claimed in claim 1, wherein the second frequency is an integer multiple of the basic frequency.

9. A frequency generator as claimed in claim 1, wherein the second frequency is a large multiple of the basic frequency.

10. A system comprising:
    a GPS radio circuit;
    a frequency generator within said GPS radio circuit, the frequency generator including a single transistor oscillator arranged such that a signal of a basic frequency appears at a first output terminal of the transistor; and
    at least one reactive circuit element, having an impedance which increases with increasing frequency throughout a frequency range of interest, the reactive circuit element being connected to a second output terminal of the same transistor and being connected to AC ground such that a signal of a second frequency appears at the second output terminal of the same transistor, the second frequency being within the said frequency range, and being a multiple of the basic frequency.

11. The system as claimed in claim 10 further including a mobile telephone and wherein the GPS radio circuit further includes a GPS radio receiver.

12. A frequency generator, comprising:

a single transistor oscillator arranged such that a signal of a basic frequency appears at a first output terminal of the transistor; and an inductance, connected between a second output terminal of the transistor and AC ground, such that the signal which appears at the second output terminal includes all multiples of the basic frequency up to a frequency at which the impedance of the inductor no longer increases with increasing frequency.

13. A frequency generator, comprising:

a single transistor oscillator arranged such that a signal of a basic frequency appears at a first output terminal of the transistor;

an inductance, connected between a second output terminal of the transistor and AC ground, such that the signal which appears at the second output terminal includes all multiples of the basic frequency up to a frequency at which the impedance of the inductor no longer increases with increasing frequency; and a filter, having an input and an output, the filter input being connected to the second output terminal of the transistor, such that the signal which appears at the filter output includes only a desired multiple of the basic frequency.

* * * * *